(12) United States Patent
Watanabe et al.

(10) Patent No.: US 8,659,321 B2
(45) Date of Patent: Feb. 25, 2014

(54) SEMICONDUCTOR DEVICE HAVING SENSE AMPLIFIER

(76) Inventors: Yuko Watanabe, Tokyo (JP); Yoshiro Riho, Tokyo (JP); Hiromasa Noda, Tokyo (JP); Yoji Idei, Tokyo (JP); Kosuke Goto, Tokyo (JP)

(*) Notice: Subject to any disclaimer, the term of this patent is extended or adjusted under 35 U.S.C. 154(b) by 36 days.

(21) Appl. No.: 13/306,560

(22) Filed: Nov. 29, 2011

(65) Prior Publication Data

US 2012/0133399 A1     May 31, 2012

(30) Foreign Application Priority Data

Nov. 30, 2010   (JP) ................................ 2010-266590

(51) Int. Cl.
  *G01R 19/00*     (2006.01)
  *G11C 7/00*      (2006.01)
  *H03F 3/45*      (2006.01)

(52) U.S. Cl.
  USPC ............................... 327/51; 327/55; 365/207

(58) Field of Classification Search
  USPC ................... 327/51, 52, 55, 57; 365/205, 207
  See application file for complete search history.

(56) References Cited

U.S. PATENT DOCUMENTS

| | | | | |
|---|---|---|---|---|
| 5,530,640 A | * | 6/1996 | Hara et al. | 363/60 |
| 5,764,580 A | * | 6/1998 | Suzuki et al. | 365/205 |
| 5,831,910 A | * | 11/1998 | Suzuki et al. | 365/189.11 |
| 6,169,698 B1 | * | 1/2001 | Sukegawa et al. | 365/226 |
| 2007/0070711 A1 | * | 3/2007 | Kim | 365/189.01 |
| 2007/0195624 A1 | * | 8/2007 | Song | 365/205 |
| 2008/0151674 A1 | * | 6/2008 | Ohata et al. | 365/227 |

FOREIGN PATENT DOCUMENTS

JP            10-242815 A       9/1998

* cited by examiner

*Primary Examiner* — Quan Tra
(74) *Attorney, Agent, or Firm* — Sughrue Mion, PLLC

(57) ABSTRACT

A semiconductor device includes a first driver circuit for supplying a first potential to a first power supply node of the sense amplifier, second and third driver circuits for supplying a second potential and a third potential to a second power supply node of the sense amplifier, and a timing control circuit for controlling operations of the first to third driver circuits. The timing control circuit includes a delay circuit for deciding an ON period of the third driver circuit. The delay circuit includes a first delay circuit having a delay amount that depends on an external power supply potential and a second delay circuit having a delay amount that does not depend on the external power supply potential, and the ON period of the third driver circuit is decided based on a sum of the delay amounts of the first and second delay circuits.

12 Claims, 10 Drawing Sheets

SEMICONDUCTOR DEVICE HAVING SENSE AMPLIFIER

BACKGROUND OF THE INVENTION

1. Field of the Invention

The present invention relates to a semiconductor device, and particularly to a semiconductor device having a sense amplifier for amplifying a potential difference occurring in a pair of bit lines.

2. Description of Related Art

A semiconductor memory device such as DRAM (Dynamic Random Access Memory) employs a sense amplifier for amplifying slight data read from memory cells to bit lines. The sense amplifier typically has a flip-flop circuit structure, in which one of a pair of bit lines at a high potential side is driven via a high-potential side common source line and the other at a low potential side is driven via a low-potential side common source line.

Since when the semiconductor memory device performs a read operation, many sense amplifiers are activated at the same time, there are problems that the potentials of the common source lines vary and a sense sensitivity and a sense speed lower. In order to solve the problems, there may be employed a system for overdriving the high-potential side common source line to a higher potential early in a sense operation (see Japanese Patent Application Laid-Open No. H10-242815). In the semiconductor memory described in Japanese Patent Application Laid-Open No. H10-242815, the common source line is overdriven to an external power supply potential early in the sense operation, thereby reducing a potential drop in the common source line.

The semiconductor memory described in Japanese Patent Application Laid-Open No. H10-242815 employs a delay circuit depending on a level of an internal power supply potential $V_{INT}$ and a delay circuit depending on a level of an external power supply potential $V_{CC}$ thereby to define a start timing of an overdrive period by an output of the former delay circuit and to define an end timing of the overdrive period by an output of the latter delay circuit. Thereby, the overdrive period is decided by a difference between the delay amount of the former delay circuit and the delay amount of the latter delay circuit.

However, since the internal power supply potential level is stabilized, the start timing of the overdrive period is substantially fixed. This means that a length of the overdrive period directly reflects the external power supply potential level, and thus there occurs a problem that the variation amount of the overdrive period depending on the external power supply potential level is too much. Since the overdrive period needs to be designed at an optimum value depending on the external power supply potential level, when the variation amount of the overdrive period is too much, a parameter with a large variation (the overdrive period) needs to match with a parameter with a large variation (the external power supply potential level) and thus the circuit is so difficult to be designed.

SUMMARY

In one embodiment, there is provided a semiconductor device that includes: a pair of bit lines; a sense amplifier having first and second power supply nodes, the sense amplifier connecting one of the pair of bit lines to the first power supply node and connecting the other of the pair of bit lines to the second power supply node based on a potential difference between the pair of bit lines; a first driver circuit supplying a first potential to the first power supply node of the sense amplifier; a second driver circuit supplying a second potential to the second power supply node of the sense amplifier; a third driver circuit supplying a third potential to the second power supply node of the sense amplifier; and a timing control circuit controlling operations of the first to third driver circuits, wherein a potential difference between the first potential and the third potential is larger than a potential difference between the first potential and the second potential, the timing control circuit turns the first and third driver circuits ON and then turns the third driver circuit OFF and turns the second driver circuit ON, the timing control circuit includes a plurality of delay circuits that decide an ON period of the third driver circuit, the delay circuits include a first delay circuit having a delay amount that depends on an external power supply potential supplied from outside and a second delay circuit having a delay amount that does not depend on the external power supply potential, and the ON period of the third driver circuit is decided based on a sum of the delay amounts of the first and second delay circuits.

DETAILED DESCRIPTION OF THE EMBODIMENTS

Preferred embodiments of the present invention will be explained below in detail with reference to the accompanying drawings.

Figure 1:
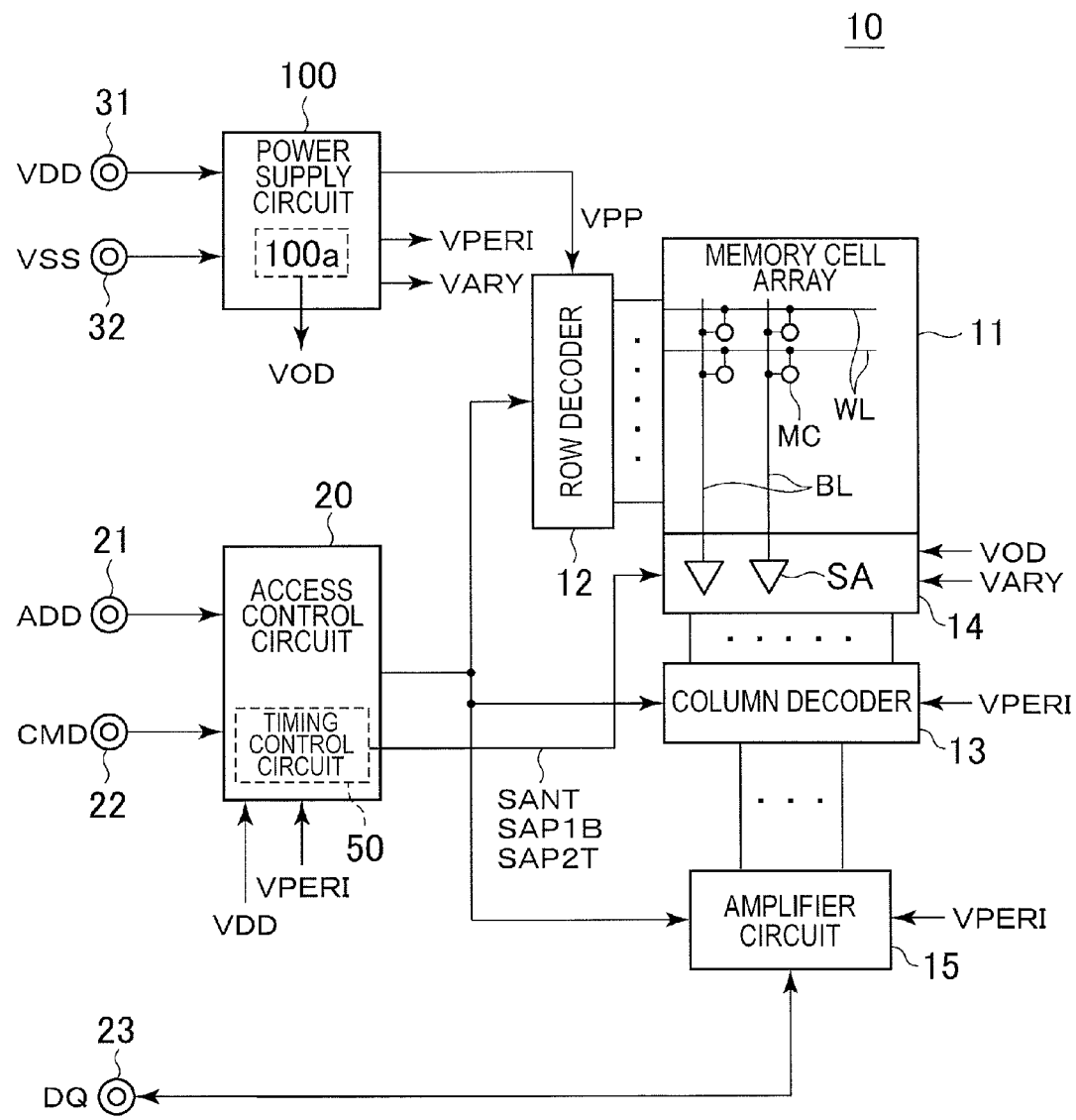
FIG. 1 is a block diagram indicative of an embodiment of a semiconductor device 10 according to the present invention.

Referring now to FIG. 1, the semiconductor device 10 according to the present embodiment is a DRAM, and comprises a memory cell array 11. The memory cell array 11 is provided with a plurality of word lines WL and a plurality of bit lines BL crossing with each other, and a memory cell MS is arranged at each intersection therebetween. The word line WL is selected by a row decoder 12 and the bit line BL is selected by a column decoder 13. The bit line BL is connected to a corresponding sense amplifier SA in a sense circuit 14 and the bit line BL selected by the column decoder 13 is connected to an amplifier circuit 15 via the sense amplifier SA. A structure of the sense circuit 14 will be described later.

Operations of the row decoder 12, the column decoder 13 and the amplifier circuit 15 are controlled by an access control circuit 20. The access control circuit 20 receives an address signal ADD and a command signal CMD externally supplied via an address terminal 21 and a command terminal 22, and thereby controls the operations of the row decoder 12, the column decoder 13 and the amplifier circuit 15 based on the address signal ADD and the command signal CMD.

Specifically, when the command signal CMD indicates an active operation, the address signal ADD is supplied to the row decoder 12. In response to this, the row decoder 12 selects a word line WL indicated by the address signal ADD and thus a corresponding memory cell MC is connected to a bit line BL. When the command signal CMD indicates a read operation or write operation, the address signal ADD is supplied to the column decoder 13. In response to this, the column decoder 13 connects a bit line BL indicated by the address signal ADD to the amplifier circuit 15. Therefore, when the command signal CMD indicates the read operation, read data DQ read from the memory cell array 11 via the sense amplifier SA is output via the amplifier circuit 15 from a data terminal 23 to the outside. On the other hand, when the command signal CMD indicates the write operation, write data DQ supplied from the outside via the data terminal 23 is written into the memory cell MC via the amplifier circuit 15 and the sense amplifier SA.

The access control circuit 20 includes a timing control circuit 50. The timing control circuit 50 generates timing signals SANT, SAP2T and SAP1B for controlling the operation timing of the sense circuit 14. The timing control circuit 50 will be detailed later.

Each circuit block uses a respective predetermined internal voltage as operational power supply. The internal power supply is generated by a power supply circuit 100 shown in FIG. 1. The power supply circuit 100 receives an external power supply potential VDD and a ground potential VSS supplied via power supply terminals 31 and 32, respectively, and thereby generates internal voltages VPP, VPERI, VARY and VOD based on the potentials. VDD, VPP, VPERI, VARY and VOD in the present specification indicate not only the potential level but also a potential difference (voltage) relative to the ground potential VSS. For example, "VDD" indicates not only the potential level itself of the external power supply potential VDD but also a potential difference (voltage) relative to the ground potential VSS. This is applicable to VPP, VPERI, VARY and VOD. In the present embodiment, $$VPP > VDD > VPERI \approx VARY$$

is obtained. Though detailed later, when the level of the external power supply potential VDD is less than 1.4 V, $$VOD = VDD$$

is obtained, and when the level of the external power supply potential VDD is 1.4 V or more, $$VOD = 1.4 V$$

is obtained.

The internal power supply potential VPP is used in the row decoder 12. The row decoder 12 drives the word line WL selected based on the address signal ADD to the VPP level, thereby powering on a cell transistor included in the memory cell MC. The internal power supply potential VARY is used in the sense circuit 14. When the sense circuit 14 is activated, one of a pair of bit lines is driven to the VARY level and the other is driven to the VSS level, thereby amplifying the read data. The internal power supply potential VPERI is used as an operational voltage of most of peripheral circuits such as the access control circuit 20. The internal power supply potential VPERI which is lower in voltage than VDD is used as the operational voltage of the peripheral circuits, thereby achieving low power consumption. The internal power supply potential VOD is a potential for overdriving one of the pair of bit lines early in the activation of the sense circuit 14.

The level of the external power supply potential VDD is decided by its specification, but the external power supply potential VDD may be set at multiple levels depending on a specification. By way of example, in a specification in which the level of the external power supply potential VDD can be set at 1.5 V or 1.35 V, the circuit needs to be designed to correctly operate even when the level of the actually-supplied external power supply potential VDD is at 1.5 V or 1.35 V. The internal power supply potentials VPP, VARY and VPERI other than the internal power supply potential VOD remain constant irrespective of the level of the external power supply potential VDD, and their potential levels are stabilized under control of the power supply circuit 100.

Figure 2:
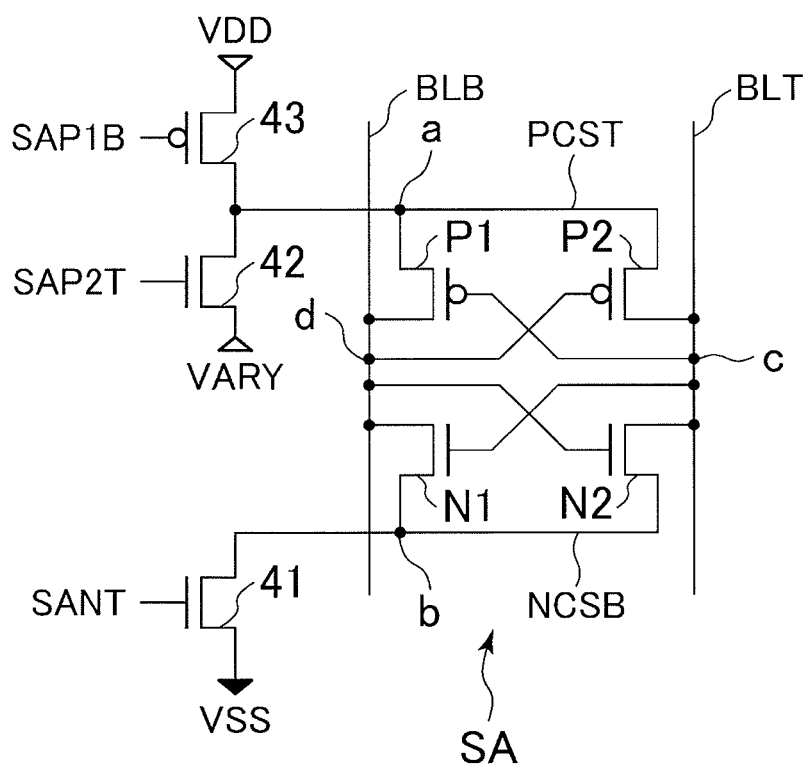
FIG. 2 is a circuit diagram indicative of an embodiment of part of a sense circuit 14 shown in FIG. 1.

Turning to FIG. 2, the sense circuit 14 includes the sense amplifier SA and driver circuits 41 to 43 for driving the sense amplifier SA. The sense amplifier SA comprises a pair of power supply nodes a, b and a pair of data I/O nodes c, d. The power supply nodes a, b in the sense amplifier SA are connected to a high-potential side common source line PCST and a low-potential side common source line NCSB, respectively. The data I/O nodes c, d in the sense amplifier SA are connected to corresponding bit lines BLT, BLB, respectively.

The sense amplifier SA comprises cross-coupled P-channel MOS transistors P1, P2 and cross-coupled N-channel MOS transistors N1, N2. A common source of the transistors P1, P2 is connected to the high-potential side common source line POST via the power supply node a, and a common source of the transistors N1, N2 is connected to the low-potential side common source line NCSB via the power supply node b. With the structure, when a potential difference occurs in the pair of bit lines BLT, BLB, the potential difference is amplified via the common source lines PCST, NCSB.

The driver circuit 41 is connected to the common source line NCSB, and when the driver circuit 41 is powered on, the common source line NCSB is driven to the ground potential VSS. The driver circuit 41 is formed of an N-channel MOS transistor. The driver circuit 42 is connected to the common source line POST, and when the driver circuit 42 is powered on, the common source line POST is driven to the internal power supply potential VARY. The driver circuit 42 is also formed of an N-channel MOS transistor. Further, the driver circuit 43 is connected to the common source line POST, and when the driver circuit 43 is powered on, the common source line POST is driven to the internal power supply potential VOD. The driver circuit 43 is formed of a P-channel MOS transistor. Gate electrodes of the transistors configuring the driver circuits 41 to 43 are supplied with the timing signals SANT, SAP2T and SAP1B, respectively. The timing signals SANT, SAP2T and SAP1B are generated by the timing control circuit 50.

Figure 3:
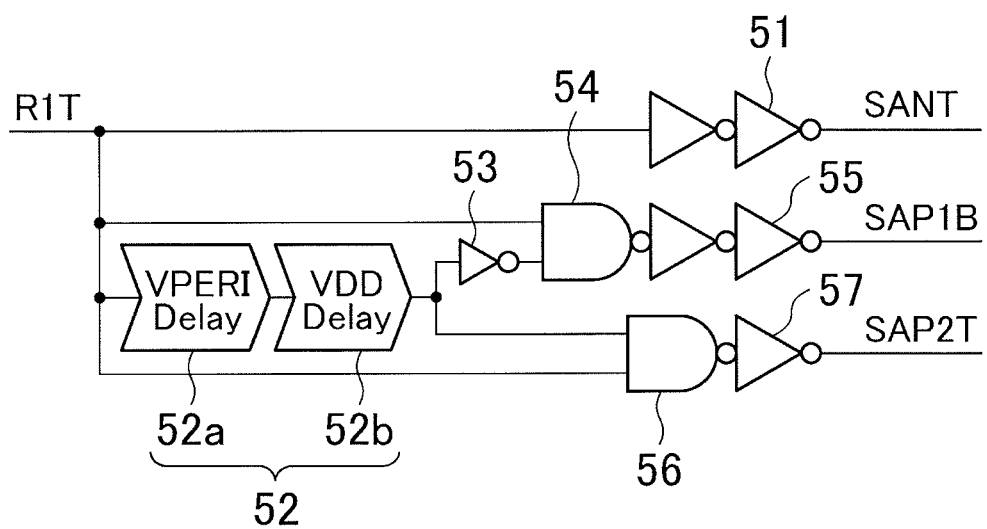
FIG. 3 is a circuit diagram indicative of an embodiment of a timing control circuit 50 shown in FIG. 1.

Turning to FIG. 3, the timing control circuit 50 generates the timing signals SANT, SAP2T and SAP1B based on an active signal R1T. When a command input into the command terminal 22 is an active command, the active signal R1T is generated inside the access control circuit 20. The timing control circuit 50 is provided with an inverter 51 having even-numbered stages for adjusting a timing in response to the active signal R1T, and an output of the inverter is used as the timing signal SANT.

The timing control circuit 50 is provided with a delay circuit 52 for delaying the active signal R1T. The delay circuit 52 is formed of a delay circuit 52a using the internal power supply potential VPERI as operational power supply and a delay circuit 52b using the external power supply potential VDD as operational power supply, both of which are connected in series. An output of the delay circuit 52 is inverted by an inverter 53 and is supplied to one of the input nodes of a NAND gate circuit 54. The other of the input nodes of the NAND gate circuit 54 is directly supplied with the active signal R1T. An output of the NAND gate circuit 54 is used as the timing signal SAP1B via an inverter 55 having even-numbered stages for adjusting a timing. The output of the delay circuit 52 is also supplied to one of the input nodes of a NAND gate circuit 56. The other of the input nodes of the NAND gate circuit 56 is directly supplied with the active signal R1T. An output of the NAND gate circuit 56 is used as the timing signal SAP2T via an inverter 57 having odd-numbered stages for adjusting a timing.

Figure 4:
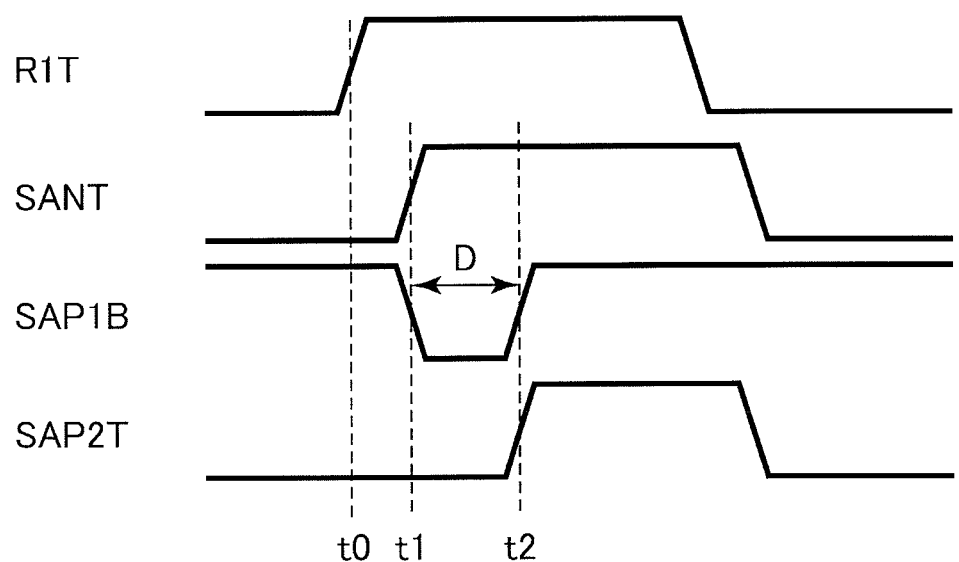
FIG. 4 is a timing chart for explaining operations of the timing control circuit 50.

Turning to FIG. 4, before time t0, the timing signals SANT, SAP2T are at a low level and the timing signal SAP1B is at a high level. Thus, the driver circuits 41 to 43 are all in OFF state, and the common source lines PCST, NCSB are not supplied with the operational voltage. Therefore, before t0, the sense amplifier SA is deactivated.

Thereafter, when the active signal R1T changes to the high level at time t0, after timing adjustment for a predetermined time, the timing signal SANT is activated to the high level and the timing signal SAP1B is activated to the low level at time t1. Thereby, the driver circuits 41, 43 are powered on so that the common source line PCST is supplied with the internal power supply potential VOD and the common source line NCSB is supplied with the external power supply potential VSS. Consequently, the sense amplifier SA is activated to start amplifying the potential difference occurring in the pair of bit lines BLT, BLB. The active signal R1T is a signal for defining an activation timing of the word lines WL, and the activation timing of the sense amplifier SA is offset to time t1 for securing a time until the potential of the bit line BLT or BLB sufficiently changes by the data read from the memory cell MC.

When the delay amount D of the delay circuit 52 has elapsed from time t1, the timing signals SAP1B, SAP2T change to the high level. Thereby, the driver circuit 43 is powered off and instead the driver circuit 42 is powered on so that the common source line PCST is supplied with the internal power supply potential VARY instead of the internal power supply potential VOD. As described above, the internal power supply potential VARY is a high-side potential of the bit line and thus one of the pair of bit lines is driven to the VARY level and the other is driven to the VSS level.

A period between time t1 and time t2 is an overdrive period in which the driver circuit 43 is being powered on. Since the internal power supply potential VOD supplied by the driver circuit 43 is higher than the internal power supply potential VARY, one of the bit lines is driven to a higher potential than the high-side potential (=VARY) in the overdrive period. Thereby, the sense sensitivity and the sense speed are enhanced.

The period between time t1 and time t2 is decided by the delay amount D of the delay circuit 52. As stated above, since the delay circuit 52 is formed of the series circuit made of the delay circuit 52a using the internal power supply potential VPERI as operational power supply and the delay circuit 52b using the external power supply potential VDD as operational power supply, the delay amount D is defined by a sum of the delay amount Da of the delay circuit 52a and the delay amount Db of the delay circuit 52b. The delay amount Da is decided by the delay circuit 52a using the stabilized internal power supply potential VPERI as operational power supply, and thus remains substantially constant irrespective of the level of the external power supply potential VDD. To the contrary, the delay amount Db is decided by the delay circuit 52b using the external power supply potential VDD as operational power supply, and thus changes depending on the level of the external power supply potential. This is because the delay circuit 52b is configured of an inverter chain, in which case as the level of the external power supply potential VDD is higher, the delay amount Db is shorter while as the level of the external power supply potential VDD is lower, the delay amount Db is longer.

Consequently, as the level of the external power supply potential VDD is higher, the overdrive period is shorter while as the level of the external power supply potential VDD is lower, the overdrive period is longer. As described later, the internal power supply potential VOD supplied to the common source line PCST in the overdrive period is associated with the external power supply potential VDD. In other words, when the level of the internal power supply potential VOD is high since the level of the external power supply potential VDD is high, the overdrive period is shortened, thereby preventing excess overdriving. To the contrary, when the level of the internal power supply potential VOD is low since the level of the external power supply potential VDD is low, the overdrive period is prolonged, thereby preventing a lack of overdriving. Thereby, an optimum amount of overdrive can be always given.

Additionally, in the present embodiment, the overdrive period is decided by the sum of the delay amount Da and the delay amount Db, and thus the VDD dependence of the overdrive period is alleviated. In other words, when the overdrive period is decided by only the delay amount Db, a change in the overdrive period depending on the level of the external power supply potential VDD is so large and thus the circuit is difficult to be designed. The reasons are as described above. To the contrary, in the present embodiment, since the overdrive period depends on the level of the external power supply potential VDD but its dependence is alleviated, the change in the overdrive period depending on the level of the external power supply potential VDD is alleviated and the circuit is easy to be designed.

Figure 5:
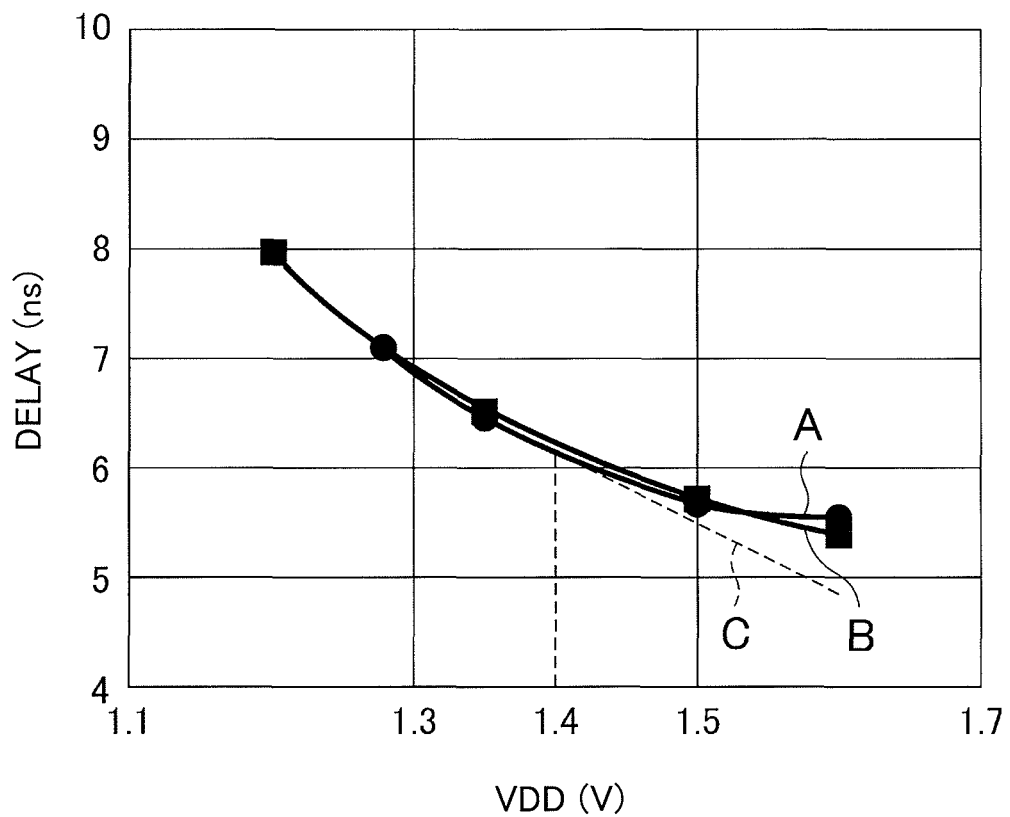
FIG. 5 is a graph for explaining a relationship between a level of an external power supply potential VDD and an overdrive period.

Turning to FIG. 5, a line A indicates an optimum overdrive period and a line B indicates an actual overdrive period. As shown in FIG. 5, according to the present embodiment, the line A and the line B substantially overlap each other, and the optimum overdrive period is given depending on the level of the external power supply potential VDD.

Figure 6:
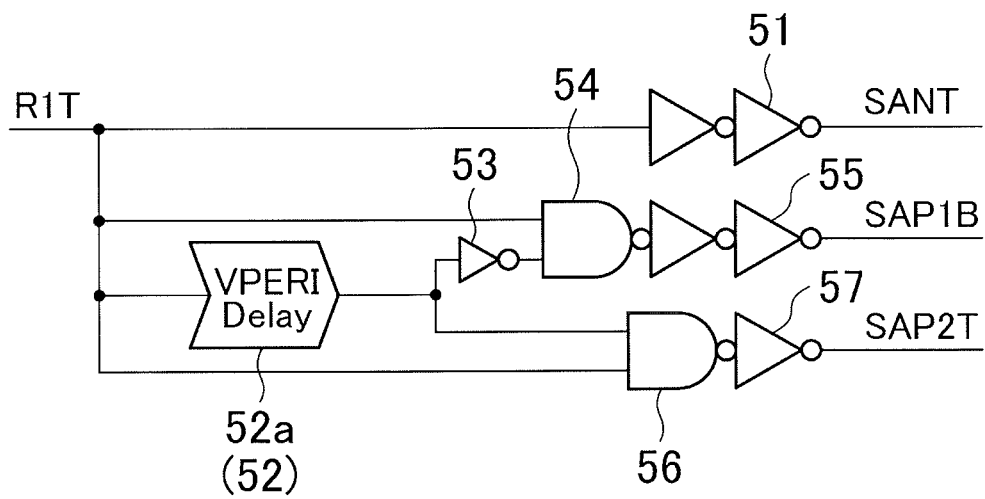
FIG. 6 is a circuit diagram of a timing control circuit 50a according to a first comparative example.
Figure 7:
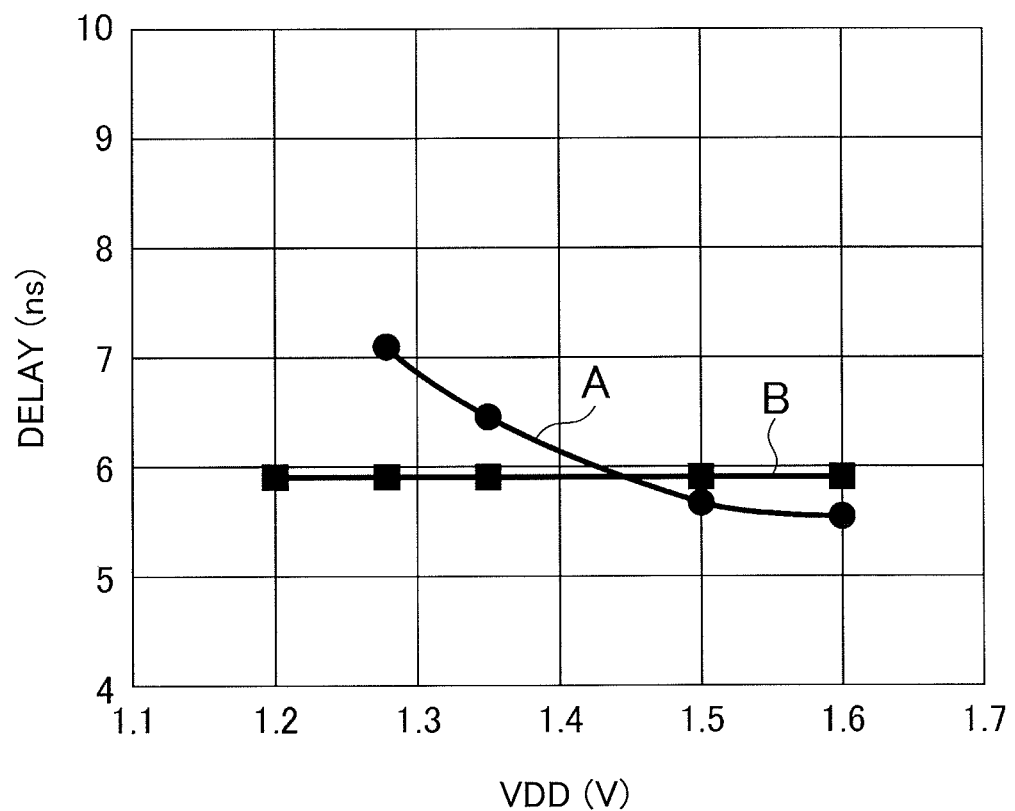
FIG. 7 is a graph for explaining a relationship between a level of an external power supply potential VDD and an overdrive period when the timing control circuit 50a is used.

Turning to FIG. 6, the timing control circuit 50a is different from the timing control circuit 50 shown in FIG. 3 in that the delay circuit 52 is formed of only the delay circuit 52a using the internal power supply potential VPERI as operational power supply. Turning to FIG. 7, a line A indicates an optimum overdrive period and a line B indicates an actual overdrive period. As shown in FIG. 7, since when only the delay circuit 52a is employed, the overdrive period does not have the VDD dependence, as the level of the external power supply potential VDD is higher, the overdriving is excess while as the level of the external power supply potential VDD is lower, the overdriving is lacking.

Figure 8:
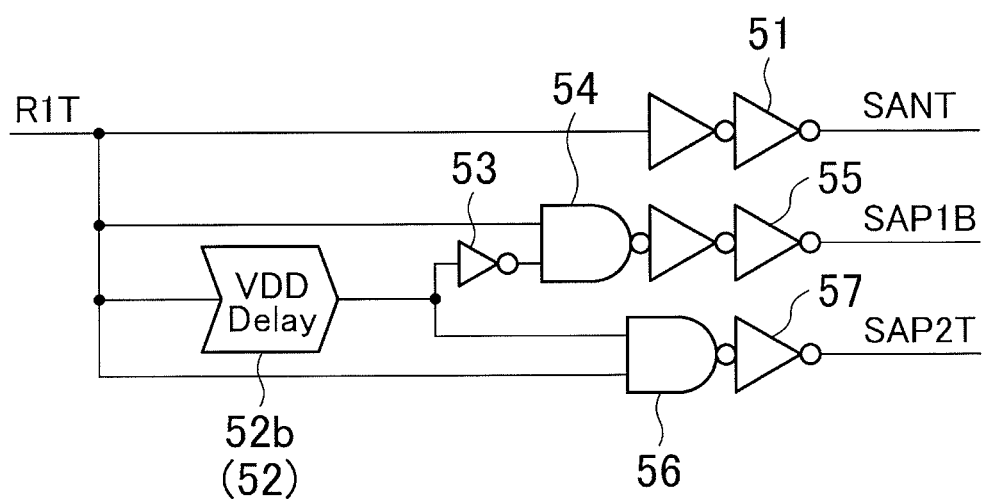
FIG. 8 is a circuit diagram of a timing control circuit 50b according to a second comparative example.
Figure 9:
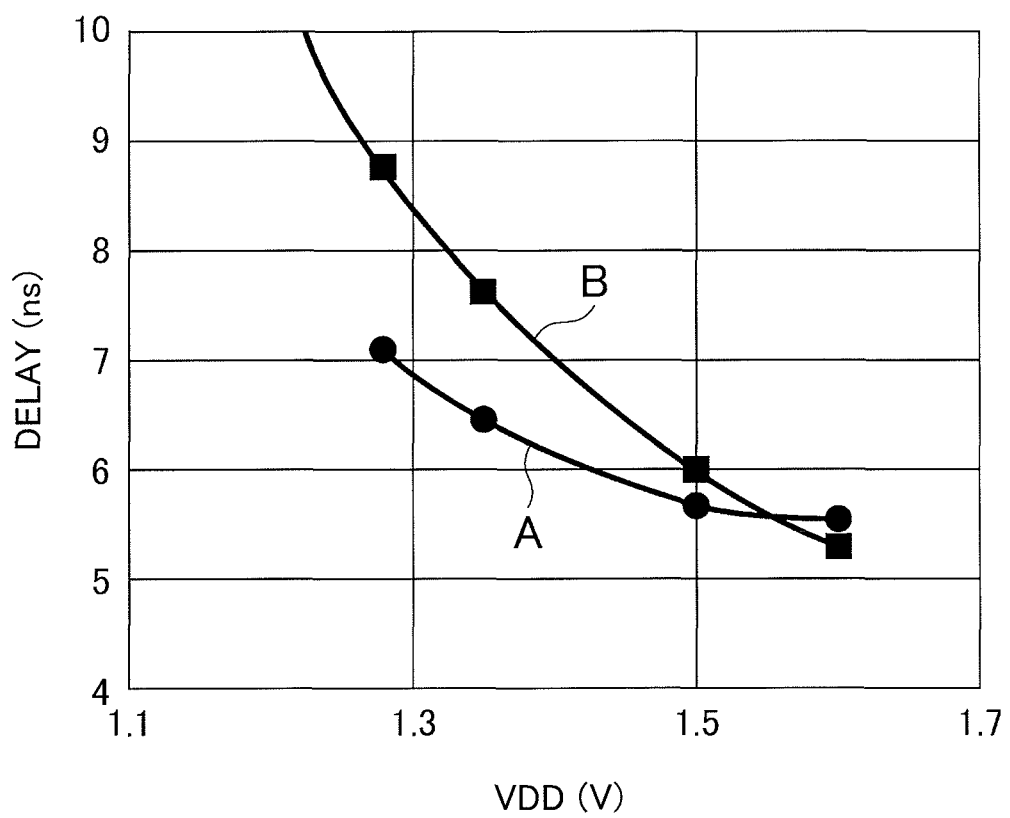
FIG. 9 is a graph for explaining a relationship between a level of an external power supply potential VDD and an overdrive period when the timing control circuit 50b is used.

Turning to FIG. 8, the timing control circuit 50b is different from the timing control circuit 50 shown in FIG. 3 in that the delay circuit 52 is formed of only the delay circuit 52b using the external power supply potential VDD as operational power supply. Turning to FIG. 8, a line A indicates an optimum overdrive period and a line B indicates an actual overdrive period. As shown in FIG. 9, since when only the delay circuit 52b is used, the overdrive period has such a strong VDD dependence, with a design in which the optimum overdrive period can be obtained in an area with the high external power supply potential VDD, as the level of the external power supply potential VDD is lower, the overdriving is excess. To the contrary, though not shown, with a design in which the optimum overdrive period can be obtained in an area with the low external power supply potential VDD, as the level of the external power supply potential VDD is higher, the overdriving is lacking.

In the present embodiment, the optimum overdrive period can be obtained depending on the level of the external power supply potential VDD in a wide range.

Figure 10:
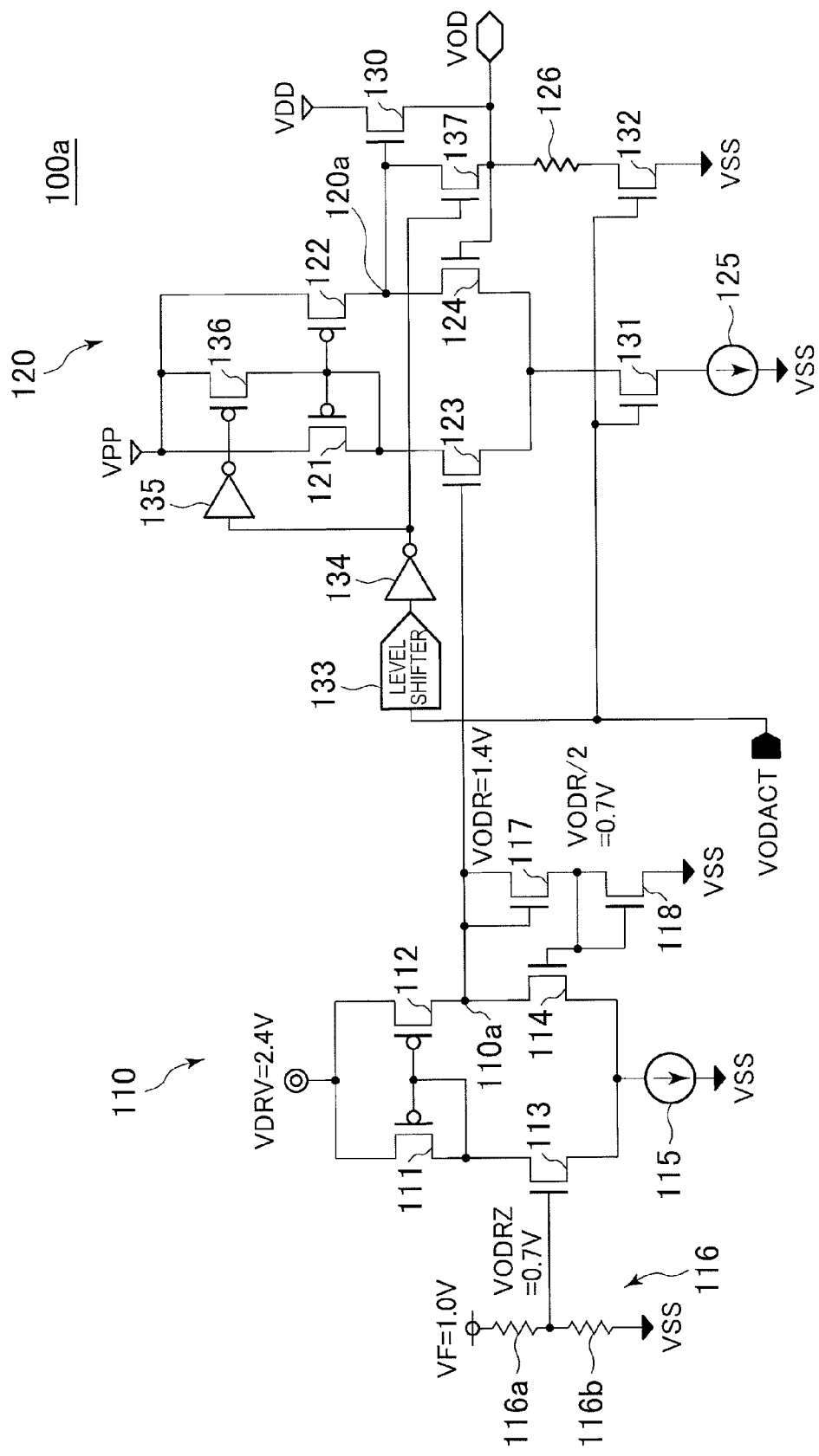
FIG. 10 is a block diagram indicative of an embodiment of a circuit block 100a (limit circuit) for generating an internal voltage VOD among circuit blocks included in a power supply circuit 100.

Turning to FIG. 10, the circuit block 100a for generating the internal voltage VOD includes a reference potential generating unit 110, a differential circuit unit 120 and a driver circuit unit 130.

The reference potential generating unit 110 is directed for generating a reference potential VODR of 1.4 V irrespective of the level of the external power supply potential VDD. Specifically, the reference potential generating unit 110 comprises a differential circuit formed of transistors 111 to 114 and a constant-current source 115, a reference circuit 116 for supplying a reference potential VODRZ of 0.7 V to a gate electrode of the transistor 113, and transistors 117, 118 diode-connected in series between an output node 110a of the differential circuit and a power supply line to which the ground level VSS is supplied.

A gate electrode of the transistor 118 is connected to a gate electrode of the transistor 114. The reference circuit 116 is configured of resistors 116a, 116b connected in series between a reference potential VF fixed at 1.0 V irrespective of the level of the external power supply potential VDD and the power supply line to which the ground level VSS is supplied, thereby generating the reference potential VODRZ of 0.7 V. The reference potential VODRZ of 0.7 V is supplied to the gate electrode of the transistor 113 and thus the level of the gate electrode of the transistor 114 is also at 0.7 V. Consequently, the level of the output node 110a of the differential circuit is doubled to be 1.4 V, which is supplied as the reference potential VODR to the differential circuit unit 120.

The differential circuit unit 120 is configured of transistors 121 to 124 and a constant-current source 125 and the reference potential VODR is supplied to a gate electrode of the transistor 123. The driver circuit unit 130 is formed of an N-channel MOS transistor, its gate electrode is connected to an output node 120a of the differential circuit unit 120, its source is connected to a gate electrode of the transistor 124, and its drain is connected to a power supply line to which the external power supply potential VDD is supplied. Thereby, when the external power supply potential VDD is 1.4 or more, the level of the internal power supply potential VOD output from the driver circuit unit 130 is fixed at 1.4 V as high as the reference potential VODR. In other words, when the internal power supply potential VOD is less than 1.4 V, the driver circuit unit 130 is powered on, and when the internal power supply potential VOD exceeds 1.4 V, the driver circuit unit 130 is powered off and a current flows via a resistor 126 and a transistor 132, and consequently the level of the internal power supply potential VOD is necessarily 1.4 V.

To the contrary, since when the external power supply potential VDD is less than 1.4 V, the transistor configuring the driver circuit unit 130 is fixed at ON state, the level of the internal power supply potential VOD output from the driver circuit unit 130 substantially matches with the level of the external power supply potential VDD. Thus, the differential circuit unit 120 has a limiter function of preventing the internal power supply potential VOD from exceeding 1.4 V.

When an operational signal VODACT is input into the differential circuit unit 120 and when it is at the high level, the differential circuit unit 120 is activated. When the operational signal VODACT is at the low level, the transistors 131, 132 are powered off, transistors 136, 137 are powered on by the operational signal VODACT given via a level shifter 133 and inverters 134, 135, and thereby the transistors 121, 122, 130 are short-circuited between the gate and the source, respectively. Thereby, the differential circuit unit 120 is deactivated and enters a no-power consumption state. Thus, the operational signal VODACT may be at the high level at a timing when the sense amplifier SA is activated, and the operational signal VODACT may be at the low level after the sense amplifier SA is deactivated.

As described above, in the present embodiment, when the level of the external power supply potential VDD is less than 1.4 V, the level of the internal power supply potential VOD is associated with the level of the external power supply potential VDD, while when the level of the external power supply potential VDD is 1.4 V or more, the level of the internal power supply potential VOD is fixed at 1.4 V. Consequently, the VDD dependence of the overdrive period is smaller in the area in which the external power supply potential VDD is 1.4 V or more. Since the amplitudes of the timing signals SANT, SAP1B have an amplitude of VDD, the VDD dependence of the overdrive period remains in the area in which the external power supply potential VDD is 1.4 V or more though the level of the internal power supply potential VOD is fixed at 1.4 V.

Turning to FIG. 5, a line C indicates an optimum overdrive period when the internal power supply potential VOD is not limited to 1.4 V. As shown in FIG. 5, when the internal power supply potential VOD is not limited, the optimum overdrive period is shortened when the external power supply potential VDD is 1.4 V or more, and thus the VDD dependence of the optimum overdrive period is stronger. To the contrary, when the external power supply potential VDD is limited to 1.4 V as in the present embodiment, the VDD dependence of the optimum overdrive period is largely alleviated in the area in which the external power supply potential VDD is 1.4 V or more, thereby more easily designing the circuit.

It is apparent that the present invention is not limited to the above embodiments, but may be modified and changed without departing from the scope and spirit of the invention.

What is claimed is:

1. A semiconductor device comprising:
   a pair of bit lines;
   a sense amplifier having first and second power supply nodes, the sense amplifier connecting one of the pair of bit lines to the first power supply node and connecting the other of the pair of bit lines to the second power supply node based on a potential difference between the pair of bit lines;
   a first driver circuit supplying a first potential to the first power supply node of the sense amplifier;
   a second driver circuit supplying a second potential to the second power supply node of the sense amplifier;
   a third driver circuit supplying a third potential to the second power supply node of the sense amplifier; and
   a timing control circuit controlling operations of the first to third driver circuits, wherein
   a potential difference between the first potential and the third potential is larger than a potential difference between the first potential and the second potential, the timing control circuit turns the first and third driver circuits ON and then turns the third driver circuit OFF and turns the second driver circuit ON, the timing control circuit includes a plurality of delay circuits that decide an ON period of the third driver circuit, the delay circuits include a first delay circuit having a delay amount that depends on an external power supply potential supplied from outside and a second delay circuit having a delay amount that does not depend on the external power supply potential, and the ON period of the third driver circuit is decided based on a sum of the delay amounts of the first and second delay circuits.

2. The semiconductor device as claimed in claim 1, further comprising a power supply circuit generating a stabilized internal power supply potential based on the external power supply potential, wherein the delay amount of the second delay circuit depends on the internal power supply potential.

3. The semiconductor device as claimed in claim 2, wherein the power supply circuit further generates the third potential based on the external power supply potential, and the power supply circuit includes a limit circuit limiting the third potential when a level of the external power supply potential is equal to or more than a predetermined value.

4. The semiconductor device as claimed in claim 3, wherein the limit circuit matches the third potential with the level of the external power supply potential when the level of the external power supply potential is less than the predetermined value, and fixes the third potential at the predetermined value when the level of the external power supply potential is equal to or more than the predetermined value.

5. A semiconductor device comprising:
a pair of bit lines;
an amplifier circuit amplifying a potential difference between the pair of bit lines;
a power supply circuit generating first and second power supply voltages based on an external power supply voltage supplied from outside;
a first node to which the first power supply voltage is supplied;
a second node to which a third power supply voltage higher than the first power supply voltage is supplied;
a first transistor connected between the first node and the amplifier circuit;
a second transistor connected between the second node and the amplifier circuit; and
a control circuit supplying first and second control signals to the first and second transistors, respectively, in response to a first signal, the control circuit including a first delay circuit operating on the external power supply voltage and a second delay circuit connected in series to the first delay circuit and operating on the second power supply voltage, and delaying the first signal by the first and second delay circuits to generate the first and second control signals.

6. The semiconductor device as claimed in claim 5, wherein the control circuit drives the second control signal from an inactive level to an active level to change the second transistor from an OFF state to an ON state, and then drives the second control signal from the activate level to the inactive level to change the second transistor from the ON state to the OFF state and drives the first control signal from an inactive level to an active level to change the first transistor from an OFF state to an ON state.

7. The semiconductor device as claimed in claim 6, wherein the first and second delay circuits control a timing at which the first control signal transits from the inactive level to the active level and a timing at which the second control signal transits from the active level to the inactive level.

8. The semiconductor device as claimed in claim 7, wherein the first and second power supply voltages are at substantially constant potential levels irrespective of a potential level of the external power supply voltage both when the external power supply voltage is at a first potential level and when the external power supply voltage is at a second potential level higher than the first potential level.

9. The semiconductor device as claimed in claim 5, wherein the power supply circuit further generates the third power supply voltage based on the external power supply voltage.

10. The semiconductor device as claimed in claim 9, wherein the power supply circuit includes a limit circuit receiving the external power supply voltage to generate the third power supply voltage, and the limit circuit changes a potential level of the third power supply voltage depending on the potential level of the external power supply voltage when the potential level of the external power supply voltage is lower than a first potential level, and controls the potential level of the third power supply voltage to the substantially constant first potential level irrespective of the potential level of the external power supply voltage when the potential level of the external power supply voltage is higher than the first potential level.

11. The semiconductor device as claimed in claim 5, wherein the first transistor has a first conductivity type and the second transistor has a second conductivity type different from the first conductivity type.

12. The semiconductor device as claimed in claim 5, wherein a potential level of the first power supply voltage is substantially the same as that of the second power supply voltage.

* * * * *